United States Patent
Popescu et al.

(10) Patent No.: US 7,189,924 B1
(45) Date of Patent: Mar. 13, 2007

(54) RACK-MOUNT COMPUTER CABLE MANAGEMENT ARM

(75) Inventors: Marius Popescu, Livermore, CA (US); Jay K. Osborn, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/173,436

(22) Filed: Jul. 1, 2005

(51) Int. Cl.
*H01B 7/06* (2006.01)

(52) U.S. Cl. .................. 174/69; 361/826; 361/825

(58) Field of Classification Search .............. 174/69; 361/826, 825, 683, 684, 685
See application file for complete search history.

(56) References Cited

U.S. PATENT DOCUMENTS

| | | | |
|---|---|---|---|
| 6,303,864 B1 * | 10/2001 | Johnson et al. ............... | 174/69 |
| 6,305,556 B1 | 10/2001 | Mayer | |
| 6,327,139 B1 | 12/2001 | Champion et al. | |
| 6,409,134 B1 | 6/2002 | Oddsen | |
| 6,435,354 B1 | 8/2002 | Gray et al. | |
| 6,523,918 B1 * | 2/2003 | Baiza ...................... | 312/265.1 |
| 6,811,039 B2 | 11/2004 | Chen et al. | |
| 6,840,388 B2 * | 1/2005 | Mayer ......................... | 211/26 |
| 7,026,551 B2 * | 4/2006 | Franz et al. .................. | 174/69 |

OTHER PUBLICATIONS

*Sun Fire E2900/V1280 and Netra 1280 Systems Lite Cable Management Arm Installation Guide*, Sun Microsystems, Inc., Apr. 2004.
*Sun Fire V440 Server Installation Guide*, Chapter 2, Sun Microsystems, Inc., 2003.

* cited by examiner

*Primary Examiner*—Jinhee Lee
(74) *Attorney, Agent, or Firm*—Meyertons Hood Kivlin Kowert & Goetzel, P.C.; B. Noël Kivlin; Chris D. Thompson

(57) ABSTRACT

A cable management system for a component mounted in a rack includes a cable management arm and a bracket. The cable management arm may include a rear link attached to the rack and a forward link coupled to the rear link. The bracket may be attached to the component. A hanger pin may provided on the forward link. The hanger pin may couple with the bracket in a slot in the bracket. The hanger pin may apply a force to the bracket such that the hanger pin carries a portion of the weight of the forward link. In some embodiments, the cable management arm includes a pivot pin. The pivot pin may couple with a second aperture in the bracket. The hanger pin may ride along a slot as the forward link is rotated about the pivot pin with respect to the bracket.

17 Claims, 9 Drawing Sheets

RACK-MOUNT COMPUTER CABLE MANAGEMENT ARM

BACKGROUND OF THE INVENTION

1. Field of the Invention

This invention relates generally to electronic equipment, such as computers, and, more particularly, to apparatus for managing cable systems used for rack-mounted components.

2. Background Information

Electronic systems such as computers are typically constructed in a modular fashion. Large systems may include several components (e.g., computer systems, servers) installed in a rack. Electronic elements of a component are commonly housed in an enclosure.

Racked computer and network systems require occasional maintenance and repair in order to achieve service with high reliability and availability. Many modern racked systems are very dense. Access to serviceable modules is often at the front or rear faces, but may also be on top, side, and/or bottom faces. Service faces that are not accessible when the unit is installed in the rack may require some form of slide assembly so that the unit can be withdrawn from the rack to expose the service faces. Typically, a pair of outer slides is installed on vertical rails on the interior sides of the rack, and a pair of complementary inner slides is installed on the exterior sides of the component. As the component is advanced in the rack, the inner slides on the component engage the outer slides on the rack such that the component is supported on the slide assemblies.

To facilitate service for systems on rack slides, and to minimize interruption of service when replacing hot-swappable modules, some systems include a cable management arm. The cable management arm may be a link or combination of links attached to one or both of a rack and a component, typically to the rear of the component. The cable management arm may support cables connecting the component to external systems and maintain the cables in a desired position as the component is moved into and out of a serviceable position on the slide assemblies.

In many cases, the end links of the arm are attached to the rack and component on one side of the rack. The weight of the cable management arm and cables attached to the arm thus creates a cantilevered load on the attachment hardware, which in turn must be carried by the adjacent component and/or rack structure. In some systems, the cable management arm may sag under the weight of the arm and the cables. In addition, the attachment structure for the links (e.g., mounting brackets) may be prone to failure when external loads such as vibration and shock are encountered during shipping or operation.

To reduce attachment loads of a cantilevered cable management arm, some systems include a fixed, rack-mounted support for the free end of the arm. However, is some fixed supports only engage when the arm is in certain positions (e.g., when the arm is in a closed position against the component). Moreover, such supports may in some instances cause binding of the linkage during insertion or removal of the component from the rack. In other systems, one end of an arm is attached to the rack on one side of the rack (e.g., the left side of the rack) and the other end of the arm is attached to component on the other side (e.g., the right side of the rack). While this arrangement may reduce loads on the hardware supporting the arm, it may impair access to modules on the rear panel of the component.

SUMMARY OF THE INVENTION

Various embodiments of cable management systems, and methods for making, using, and installing such systems, are disclosed. In an embodiment, a cable management system for a component mounted in a rack includes a cable management arm and a bracket. The cable management arm may include a rear link attachable to the rack and a forward link coupled to the rear link. In some embodiments, the cable management arm includes a middle link between the forward link and the rear link. The bracket may be attachable to the component.

The forward link may include a hanger pin that couples with the bracket in an aperture (e.g., slot) in the bracket. The hanger pin may apply a force to the bracket such that the hanger pin carries a portion of the weight of the forward link when the hanger pin is coupled to the bracket. In some embodiments, engagement of the hanger pin with a top surface of the bracket and engagement of a surface of the forward link with a bottom surface of the bracket inhibit downward rotation of the forward link relative to the component under the weight of the forward link.

In some embodiments, a forward link includes a hanger pin and a pivot pin. The pivot pin may be proximate to a front end of the forward link. The hanger pin and pivot pin may each couple with the bracket in apertures of the bracket. The pivot pin may establish a pivotal connection between the forward link and the bracket. In certain embodiments, the bracket may include a catch that retains the pivot pin in its aperture.

In some embodiments, an aperture for the hanger pin is a slot. The hanger pin may ride along the slot as the forward link is rotated with respect to the bracket. In one embodiment, the slot has an arcuate portion. The arcuate portion of the slot may have a radius of curvature that is substantially centered at a pivot pin. The hanger pin may move along the arcuate portion of the slot when the forward link is rotated with respect to the component. The hanger pin may bear against the bracket to carry a portion of the weight of the forward link when the forward link is at various angles relative to the bracket.

In some embodiments, the forward link of the cable management arm is releasable from a bracket without the use of a tool. In one embodiment, a pivot pin and a hanger pin on a forward link of a cable management arm couple with a bracket in slots on the bracket. The slots may include enlarged portions. The pins may be inserted and removed from the bracket when the pins are aligned with the enlarged portions, but not inserted or removed when the pins are not aligned with the enlarged portions.

In another embodiment, a cable management system includes a hinge that pivotally couples the forward link with the component. In one embodiment, the hinge is configured to pivotally couple the forward link with an inner slide member attached to the component.

In an embodiment, a method of installing a cable management arm for a rack-mounted component includes coupling a rear link of the cable management arm to a rack and pivotally coupling a forward link of the cable management arm with a bracket on the component, and suspending the forward link on a hanger pin coupled to the bracket. In some embodiments, a pivot pin on the forward link is inserted into a slot in the bracket, where a catch retains the pivot pin in the slot.

BRIEF DESCRIPTION OF THE DRAWINGS

Other aspects of the invention will become apparent upon reading the following detailed description and upon reference to the accompanying drawings in which.

Figure 1:
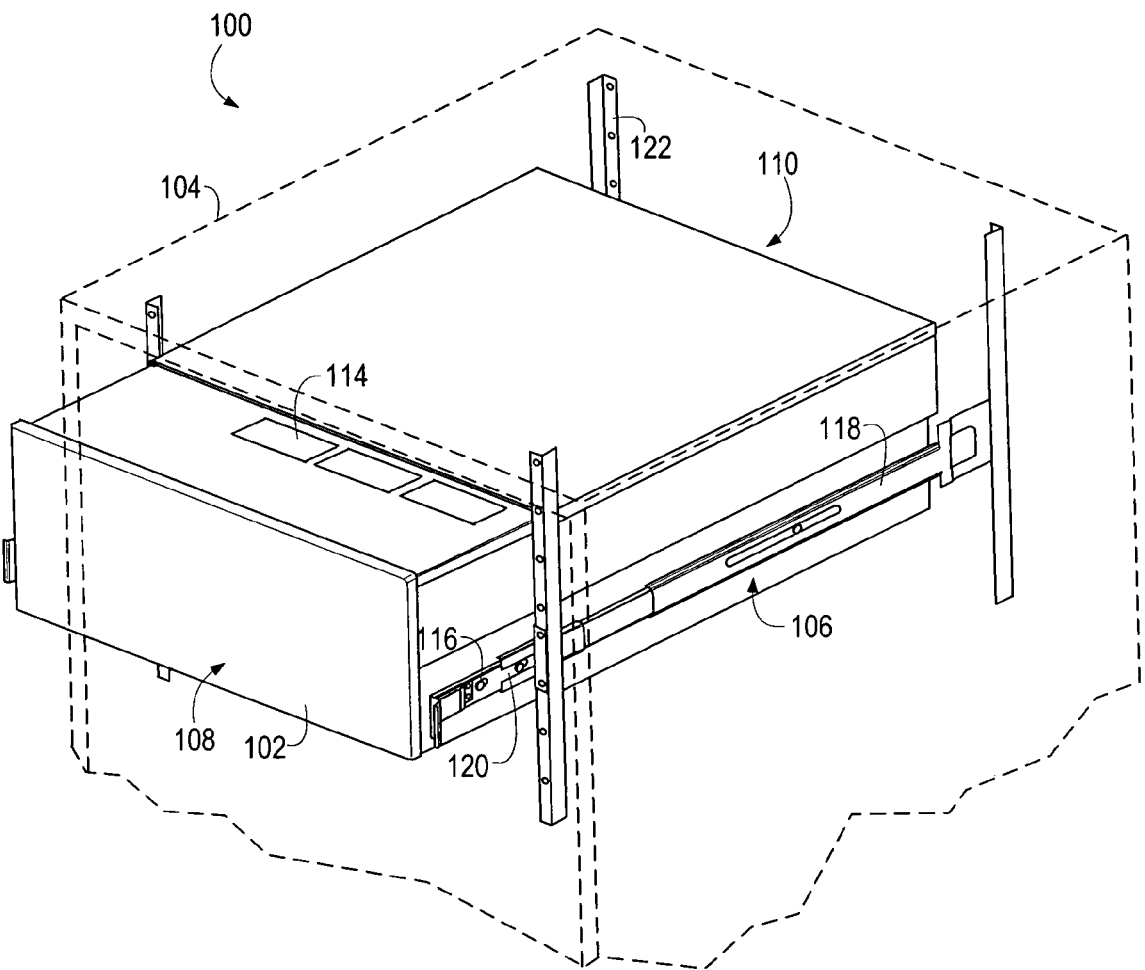
FIG. 1 depicts a component mounted in a rack on slide assemblies, with the component in a partially installed position.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

The following description generally relates to apparatus and methods for installing and removing modules from computer systems. Such systems and methods may be used in a variety of applications. A non-exhaustive list of such applications includes: telecommunications network server systems; e-commerce web server systems; LAN application and file server systems; personal computer systems; and remote vehicle control systems.

As used herein, "component" includes any component, subsystem, or element of a system. In some embodiments, a component is a rack-mounted computer system. The rack-mounted computer system may include various modules, such as circuit boards, power supplies and memory devices, installed in a common enclosure.

As used herein, "module" includes any modular unit or subsystem. Examples of a modules include, but are not limited to, power supplies, circuit modules, information-processing cartridges, a fan tray assemblies, disk drives, memory modules, and combinations thereof. In certain embodiments, a module includes multiple circuit boards (e.g., a mezzanine card mounted to a main circuit board). In certain embodiments, elements of a module are housed in an enclosure.

As used herein, "circuit module" includes any module that includes or carries elements of an electrical circuit, electrical components (including, but not limited to, semiconductor devices, resistors, capacitors, relays, switches, and connectors), or conductors (e.g., wires, traces). As used herein, "circuit board" includes any circuit module that carries one or more other circuit modules or components. "Circuit board" includes, but is not limited to, a printed circuit board made of epoxy-glass and metal layers.

A computer system may include components installed in a chassis or rack assembly. As used herein, "rack" includes any structure that supports or houses one or more elements of a computer system (e.g., electronic modules). A component may be supported in a rack by various structures including, but not limited to, slides, rails, a shelf, or a bottom of a rack. As used herein, "enclosure" or "chassis" includes any structure that supports or houses one or more elements of a module or modules.

FIG. 1 depicts an embodiment of computer system 100 including component 102 in rack 104. In FIG. 1, component 102 is shown in a partially withdrawn position. Component 102 may be mounted in rack 104 on slide assemblies 106. As used herein, "slide assembly" includes any combination of elements that allows a component to be slid or translated at least part way into or out of a rack. Slide assemblies 106 may be provided on the left and right sides of rack 104. Component 102 may include front panel 108, rear panel 110, and various modules, such as modules 114. In some embodiments, modules 114 of component 102 may be hot-swappable. During hot swap, some or all of the cabling for component 102 may remain connected.

Slide assemblies 106 may include inner slide members 116, outer slide members 118, and middle slide members 120. Inner slide members 116 may be attached to the sides of component 102. Outer slide members 118 may be attached to front and rear rails 122 of rack 104. It will be understood that a slide assembly may be designed to mount in a rack having fewer rails (e.g., a rack having only front rails, or only rear rails). Inner slide member 116 may slide in middle slide member 120. Middle slide member 120 may slide within a limited range on outer slide member 118.

When service is required on component 102, the component may be withdrawn out of rack 104 on slide assemblies 106 to a position that allows for replacement of modules and/or opening of access panels. Middle slide members 120 may be telescoping members that slide out some or all of the distance traveled by component 102, thereby providing additional support to the component when the component is in the withdrawn position. In another embodiment, slide assemblies for mounting a component include only inner slide members and outer slide members, with middle slide members being omitted. Slide members may have various cross-sectional shapes, including, but not limited to, c-shaped, rectangular, square, or j-shaped.

Figure 2:
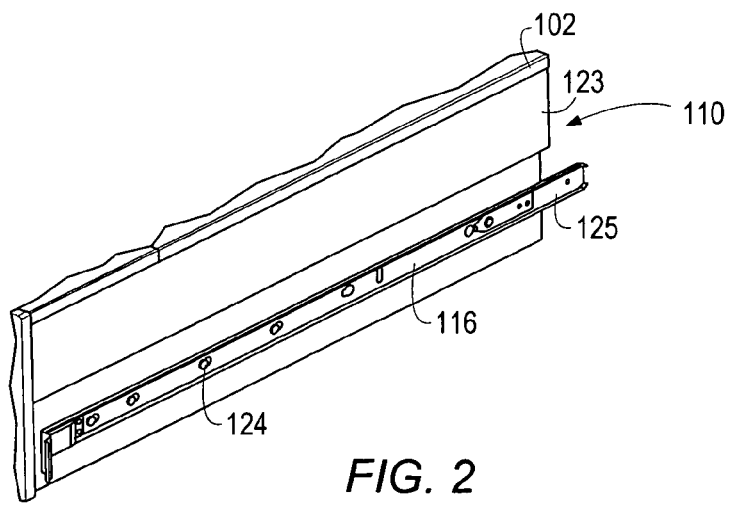
FIG. 2 depicts a component including an inner slide member.

FIG. 2 depicts a partial view of one side of component 102. Inner slide member 116 may be attached to component 102 using fasteners 124. Rear portion 125 of inner slide member 116 may extend beyond rear panel 110. Sides of component 102 may include overhang 123. Overhang 123 may allow the internal width of component 102 above the inner slide member to be the maximum allowed by the rack space, thereby increasing space available for circuit modules and other elements of the component.

Figure 3:
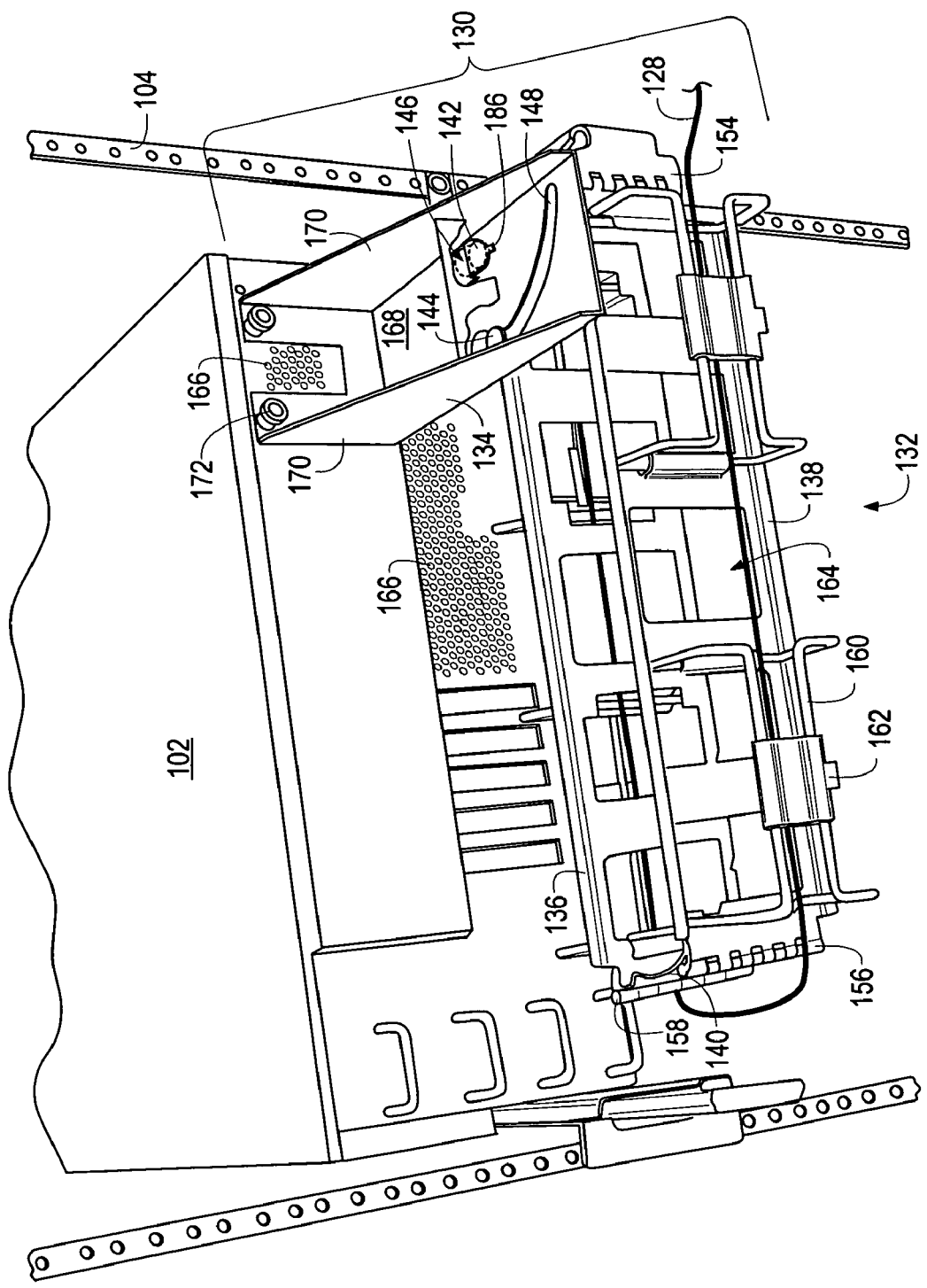
FIG. 3 is a view of the rear panel of a computer system including a cable management arm in a closed position.

FIG. 3 depicts a rear view of computer system 100. Computer system 100 may include cables 128 carried on cable management system 130. Cable management system 130 may support and protect cables 128 and provide strain relief to the cables when component 102 is in various positions on slide assemblies 106. In FIG. 3, component 102 is fully installed in rack 104 and cable management system 130 is in a closed position with respect to component 102.

Cable management system 130 may include cable management arm 132 and bracket 134. Cable management arm 132 may include forward link 136, rear link 138, and middle link 140. Forward link 136 may be coupled to component 102 using bracket 134. Forward link 136 may include or carry pivot pin 142 and hanger pin 144. Forward link 136 may be pivotally coupled to bracket 134 at pivot pin 142. Pivot pin 142 may engage bracket 134 in slot 146 of bracket 134. Hanger pin 144 may engage bracket 134 in slot 148 of bracket 134.

Rear link 138 may be pivotally coupled to outer slide member 118 (shown in FIG. 1) at hinge 154. Middle link 140 may be pivotally coupled to forward link 136 and rear link 138 at hinges 156, 158. When component 102 is in a given position in rack 104, forward link 136, middle link 140, and rear link 138, in combination with the fixed component/rack structure, may form a four-bar linkage. Thus, forward link 136, middle link 140, and rear link 138 of cable management arm 132 may be moved while component 102 is in a fixed position with respect to rack 104.

Although cable management arm 132 shown in FIG. 3 has three links, a cable management arm may in other embodiments include more than three links or fewer than three links. For example, a cable management arm may have only a forward link and a rear link, with no middle link. Although connections in cable management arm 132 shown in FIG. 3 are pivotal connections, connections in other embodiments of a cable management arm (between two links and between a link and a component or rack) may be other than pivotal (e.g., sliding connections, fixed connections).

Forward link 136 and rear link 138 may include cable guides 160 and retention clips 162. Cable guides 160 may guide and support cables during installation, removal, and servicing of component 102. Retention clips 162 may be removably coupled between opposing cable guides 160. Retention clips 162 may help retain cables in cable guides 160. Forward link 136 and rear link 138 may include openings 164. Openings 164 may facilitate airflow into and out of the vents 166 in rear panel 110 of component 102, thereby improving thermal performance of computer system 100. Other examples of supports for cables include, but are not limited to, brackets, hooks, or sleeves. In one embodiment, cables are supported in apertures in the link members of the cable arm.

Bracket 134 may be attached to component 102. As used herein, "bracket" includes any element that can be used to attach one element to another. As shown in FIG. 3, bracket 134 may include a base 168 and flanges 170. Flanges 170 may enhance strength and stiffness of bracket 134 when loads are placed on bracket 134 (e.g., due to the weight of the cable management arm) during installation or service. A bracket may have various other forms, including, but not limited to, rectangular, circular, tubular, semicircular, cee-shaped, or vee-shaped. Bracket 134 may be attached to component 102 with thumbscrews 172. Other suitable fasteners for attaching bracket 134 to component 102 include, but are not limited to, bolts, machine screws, or rivets.

Figure 4:
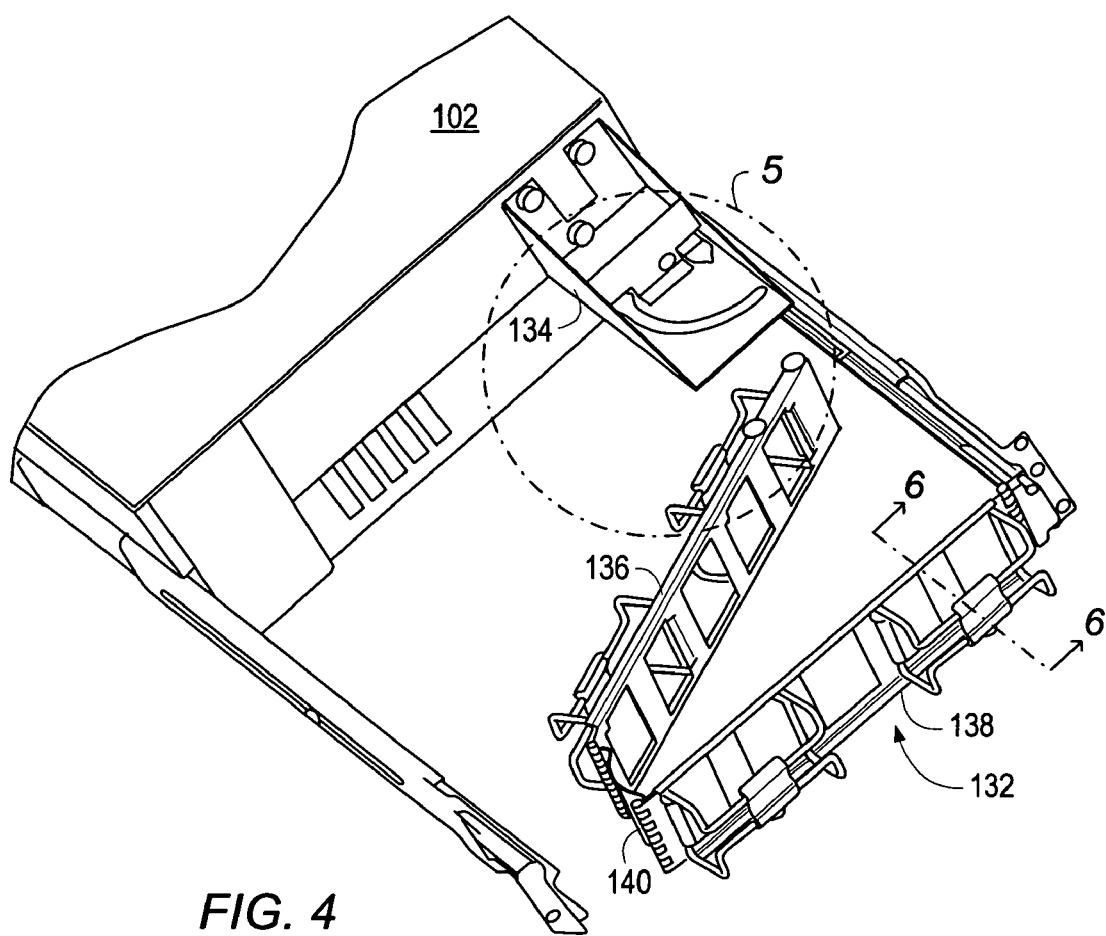
FIG. 4 depicts a computer system including a cable management system with a cable management arm and bracket.
Figure 5:
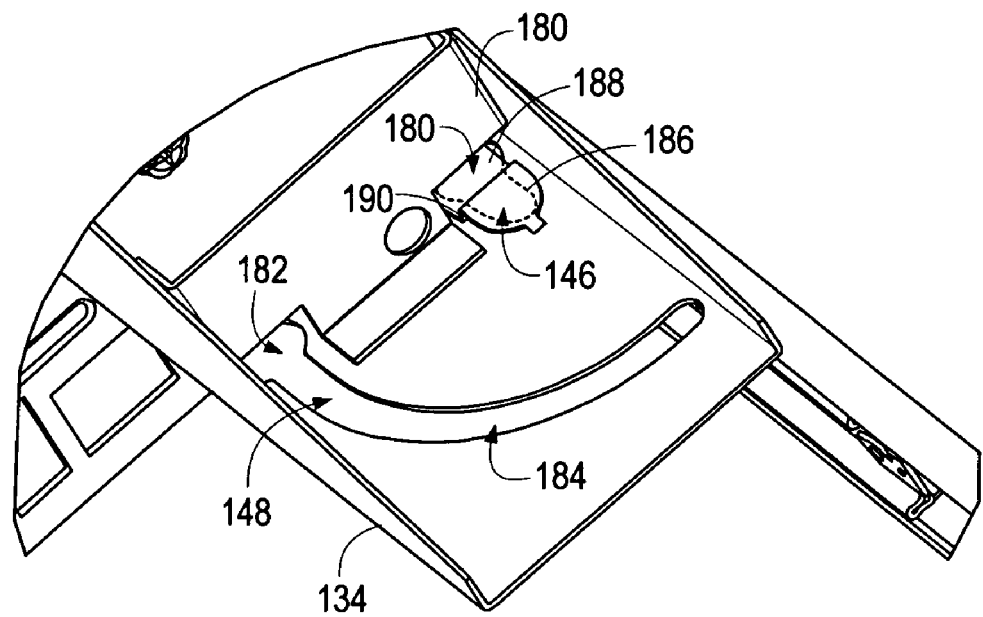
FIG. 5 is a detail view of a front link and bracket of a cable management system taken in zone 5—5 of FIG. 4.
Figure 5:
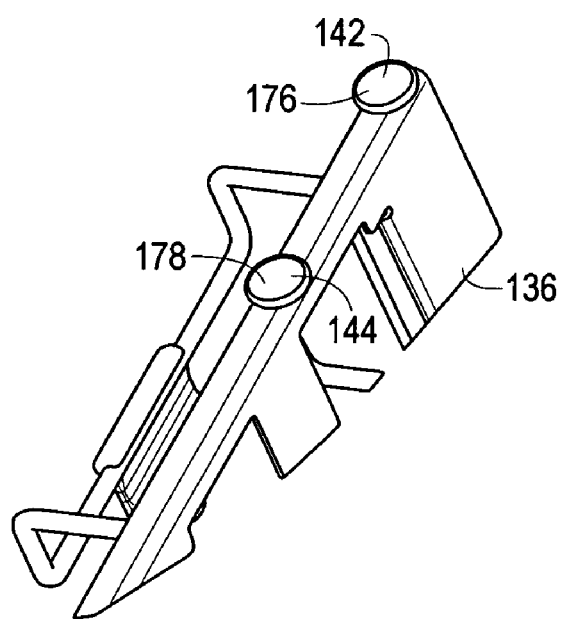

FIG. 4 depicts computer system 100 when cable management arm 132 is not connected to bracket 134. FIG. 5 is a detail view of bracket 134 and forward link 136 when forward link 136 is not connected to bracket 134. Pivot pin 142 and hanger pin 144 may be attached to an upper surface of forward link 136. Rack 104 is not shown in FIGS. 4 and 5 for clarity. As used herein, a "pin" includes any pin, shaft, bar, rod, post, tab, peg, or elongated member, that can extend or pass into a hole, slot, or other opening in another element. A pin may have various regular or irregular cross-sections, including, but not limited to, round, square, rectangular, hexagonal, or hexalobular, and may be long or short. A pin may be integral to another member (e.g., machined into forward link 136) or a separate part.

Referring to FIG. 5, pivot pin 142 may include head 176. Hanger pin 144 may include head 178. Head 176 may be larger than than the body of pivot pin 142. Head 178 may be larger than the body of hanger pin 144. Heads of a pin may have various forms, including, but not limited to, square, ovate, star-shaped, or rectangular. In one embodiment, the head of a pin has one or more lateral projections, such as tabs or hooks.

In some embodiments, the head of a pin is a separate part from the body of the pin (e.g., the head of a bolt is screwed into a tapped hole in a body of the pin). In another embodiment, a head is integral to the body of the pin. Heads 176 and 178 may be the same or different.

As used herein, a "hanger pin" includes any pin that engages (e.g., contacts) a portion of one element to carry the weight of another element. For example, hanger pin 144 may engage bracket 134 adjacent to slot 148 to carry a portion of the weight of cable management arm 132. Hanger pin 144 may be a sufficient distance from pivot pin 142 to carry a substantial portion of the weight of cable management arm 132, but close enough to pivot pin 142 allow cable management system 130 to have a relatively low profile relative to rear panel 110 of component 102 when cable management system 130 is in a closed position. Hanger pin 144 may carry a portion of the load of cantilevered cable management arm 132 that would otherwise be carried entirely at the front end of the forward link, thereby increasing strength and stiffness of the pivot joint. A stiffer pivot joint may inhibit a cable management arm from sagging at the free end of the arm. In some embodiments, engagement of the hanger pin with a top surface of the bracket and engagement of a surface of the forward link with a bottom surface of the bracket inhibit rotation of the forward link relative to the component under the weight of the forward link.

In some embodiments, a pin may couple with an intermediate element that engages a top surface of the bracket. For example, a top portion of a hanger pin might include a hole for a transverse pin (e.g., cotter pin). The transverse pin may engage a top surface of a bracket when weight is suspended on the hanger pin. In another embodiment, a hanger pin couples with a cap that is attached (e.g., by mating threads) after passage of the head through an aperture in the bracket. In still another embodiment, a hanger pin includes an expandable (e.g., spring loaded) head that expands after passing through a hole in a bracket to inhibit separation of the pin from the bracket.

In certain embodiments, a pin (e.g., hanger pin) may be pre-installed on a bracket for a cable management arm before installation of the cable management arm in a rack. When the cable management arm is installed the rack, the pin may couple in a receptacle or with mating element (e.g., hook) on a link of the arm.

Referring again to FIG. 5, slot 146 of bracket 134 may include enlarged portion 180. Slot 148 of bracket 134 may include enlarged portion 182. Enlarged portion 180 of slot 146 may be large enough to receive head 176 of pivot pin 142. Enlarged portion 182 of slot 148 may be large enough to receive head 178 of hanger pin 144. Other portions of slots 146, 148 may be narrower than head 176 of pivot pin 142 and head 178 of hanger pin 144, respectively. As described below, enlarged portions 180,182 may allow forward link 136 to be coupled to and decoupled from bracket 134 without tools or separate fasteners.

Slot 148 may include arcuate portion 184. Arcuate portion 184 may accommodate hanger pin 144. In one embodiment, arcuate portion 184 has a radius of curvature centered substantially at an axis of pivot pin 142 when forward link 136 is installed on bracket 134. Hanger pin 144 may ride in bracket 134 in arcuate portion 184 of slot 148 when forward link 136 is rotated about pivot pin 142. Slot 148 may allow hanger pin 144 to support forward link 136 through the entire rackslide stroke of component 102. Although the embodiment shown in FIG. 5 includes slots for receiving pivot pin 142 and hanger pin 144, various other apertures may be provided on bracket to receive pins on a link, such as round, square, or ovate holes.

Bracket 134 may include catch 186. Catch 186 may include spring portion 188 and stop 190. Catch 186 may retain pivot pin 142 in slot 148 when pivot pin 142 is positioned in the narrow, rearward portion of slot 148, as shown in FIG. 3. Catch 186 may allow forward link 136 to be coupled to, and decoupled from, component 102 without tools. In other embodiments, a pivot pin may be retained in a bracket using other components, such as a clip, a slide, or a lock nut.

Figure 6:
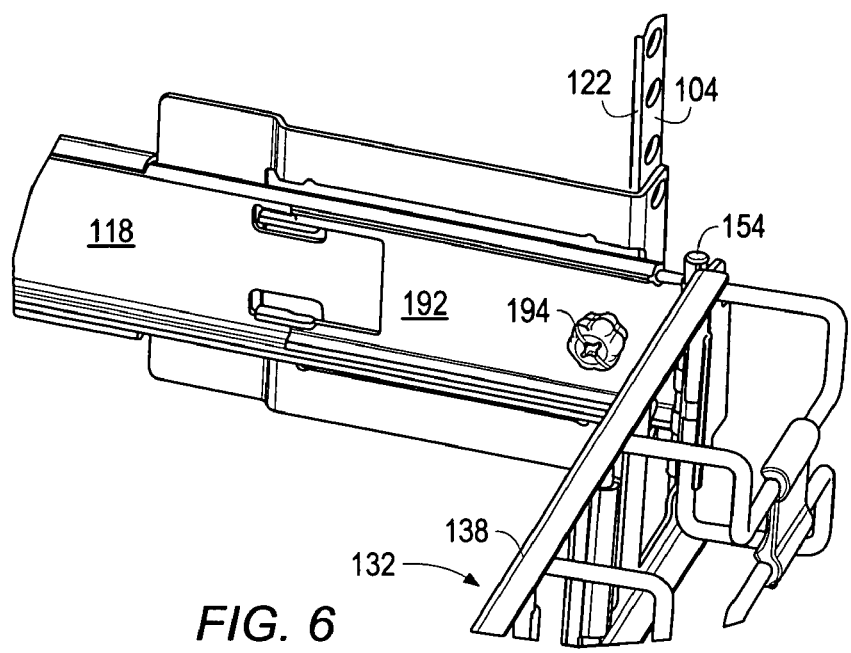
FIG. 6 is a detail view of attachment of a rear link of a cable management arm to an outer slide member on a rack taken substantially in the direction of lines 6—6 of FIG. 4.

FIG. 6 depicts attachment of cable management arm 132 to rack 104. Cable management arm 132 may include side bracket 192. Rear link 138 may be pivotally coupled to side bracket 192 at hinge 154. Side bracket 192 may be attached to outer slide member 118. Thumbscrew 194 may be used to secure side bracket 192 on outer slide member 118. In certain embodiments, rear link 138 or a side bracket for the rear link is attached directly to rack rail 122 or to another part of rack 104.

Figure 7:
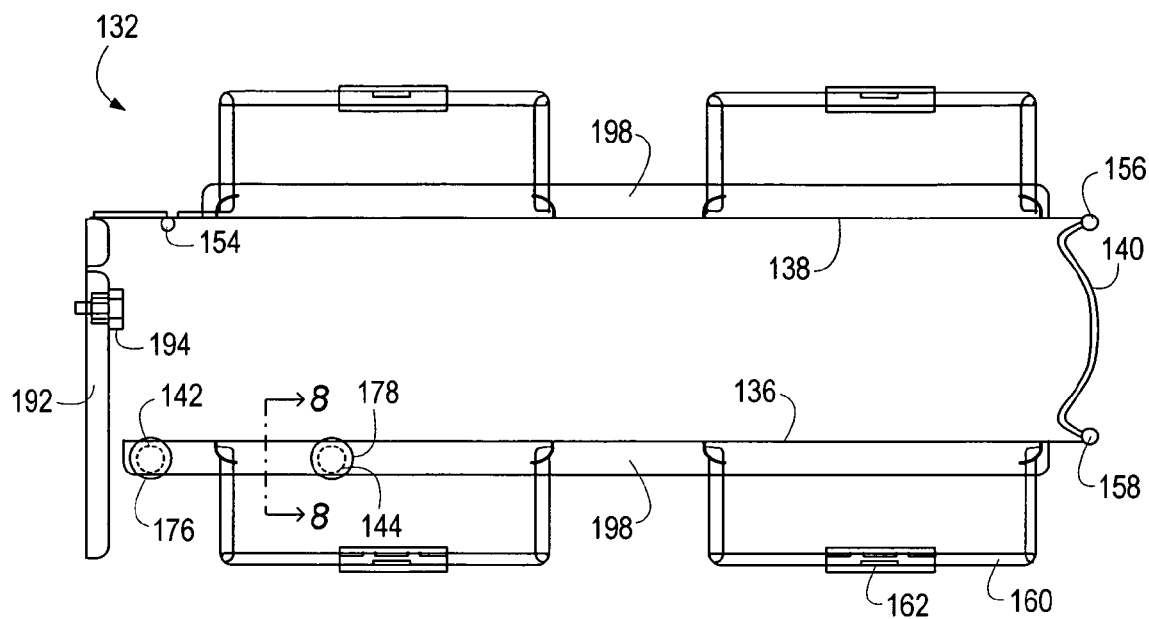
FIG. 7 is a top view of a cable management arm.

FIG. 7 depicts a top view of cable management arm 132. Side bracket 192 and rear link 138 may be pivotally connected at hinge 154. Middle link 140 may be pivotally connected to rear link 138 at hinge 156 and forward link 136 at hinge 158. In some embodiments, thumbscrew 194 is a captive fastener. Thumbscrew 194 may be pre-installed on side bracket 192. A cable management arm may include other devices for attaching the arm to a slide member or rack structure, such as clamps, machine screws, or bolts.

Figure 8:
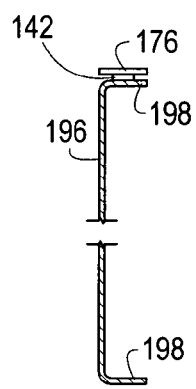
FIG. 8 is a section view of a forward link taken substantially along lines 8—8 of FIG. 7.

FIG. 8 depicts a section view of forward link 136. Forward link 136 may include web 196 and flanges 198. Flanges 198 may provide stiffness to cable management arm 132. Other suitable cross sections for a link include, but are not limited to, rectangular, round, I-shaped, or T-shaped. The form of rear link 138 and middle link 140 may be the same as or different from that of forward link 136. Links of a cable management arm may be straight, curved, or a combination thereof.

In some embodiments, pivot pin 142 and hanger pin 144 are attached to (e.g., bolted, welded) to one of flanges 198 on forward link 136. In other embodiments, pivot pin 142, hanger pin 144, or both, are integrally formed with the forward link (e.g, machined or molded as a single unit).

Figure 9:
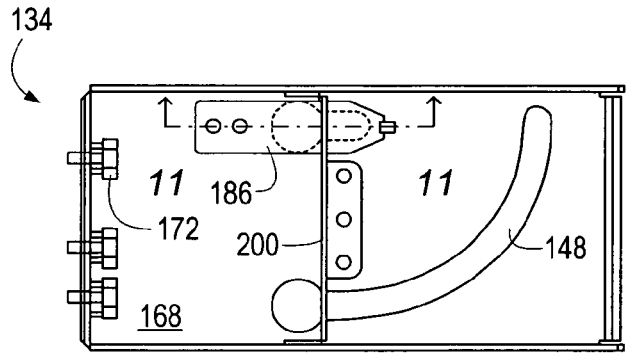
FIG. 9 is a top view of a bracket for a cable management arm.
Figure 10:
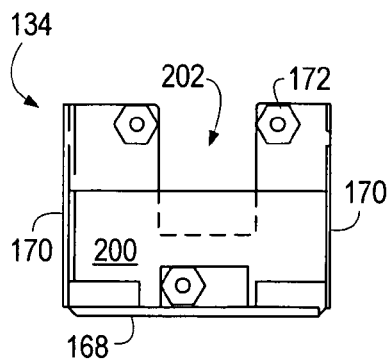
FIG. 10 is a rear view of a bracket for a cable management arm.

FIG. 9 depicts a top view of bracket 134. FIG. 10 depicts a rear view of bracket 134. As shown in FIGS. 9 and 10, bracket 134 may in some embodiments be attached to component 102 using thumbscrews 172. Thumbscrews 172 may be a captive type and be pre-installed on bracket 134. Bracket 134 may include stiffener 200 between flanges. Stiffener 200 may attached (e.g., bolted, spot welded) to base 168 and flanges 170. Bracket 134 may include cutout 202. Cutout 202 may allow airflow through vents 166 on component 102 between flanges 170 of bracket 134.

Suitable materials for forward link 136, middle link 140, rear link 138, bracket 134 may include, but are not limited to, steel, aluminum, a polymer (e.g., ABS), or a composite. In one embodiment, links of a cable management arm are formed of work-hardened, cold rolled steel. Cable guides 160 may be formed from wire, bar, or other suitable materials.

Figure 11:
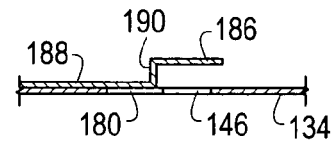
FIG. 11 is a section view of a bracket including a catch for a pivot pin.

FIG. 11 depicts catch 186 on bracket 134. Spring portion 188 of catch 186 may deflectable to allow insertion of a pin into slot 146. Spring portion may be made of spring steel, a polymer, or other suitable material.

Figure 13:
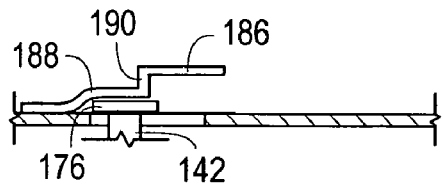
FIG. 13 is a side view of a pivot pin in an enlarged portion of a slot.
Figure 12:
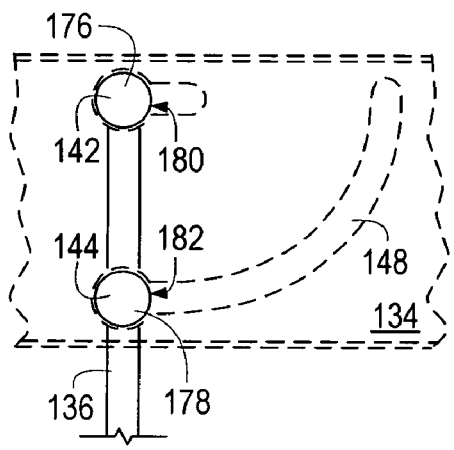
FIG. 12 is a top view of a forward link having pins aligned with enlarged portions of bracket slots.
Figure 14:
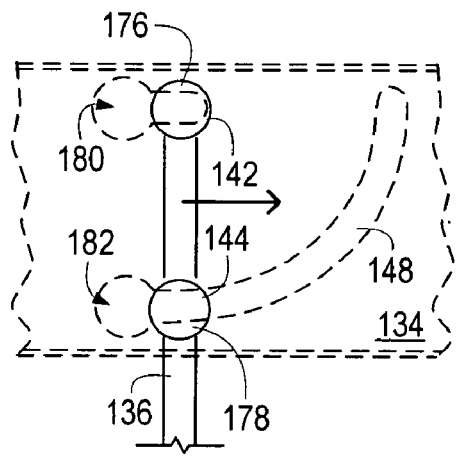
FIG. 14 is a top view of a forward link having pins in an installed position in bracket slots.

FIGS. 12–15 depict forward link 136 and bracket 134 during installation of cable management system 130. To install cable management system 130, bracket 134 may be installed on component 102 using thumbscrews 172. Cable management arm 132 may be installed on rack 104 by securing side bracket 192 to outer slide member 118 using thumbscrew 194 as shown in FIG. 6. At this point, cable management arm 132 is not connected to bracket 134 (see, e.g., FIG. 4). Component 102 may placed in a fully installed position in rack 104. Forward link 136 of cable management arm 132 may be positioned to align head 176 of pivot pin 142 with enlarged portion 180 of slot 146 and head 178 of hanger pin 144 with enlarged portion 182 of slot 148, as shown in FIG. 12. Forward link may be raised to insert heads 176, 178 through enlarged portions 180,182, as shown in FIG. 13. Catch 186 may deflect upwardly to allow pivot pin 142 to enter slot 146.

Figure 15:
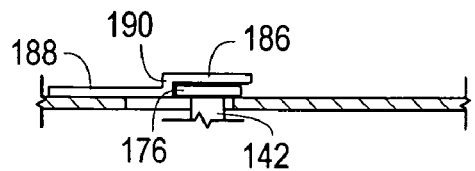
FIG. 15 is a side view of a pin in an installed position in a bracket slot.
Figure 16:
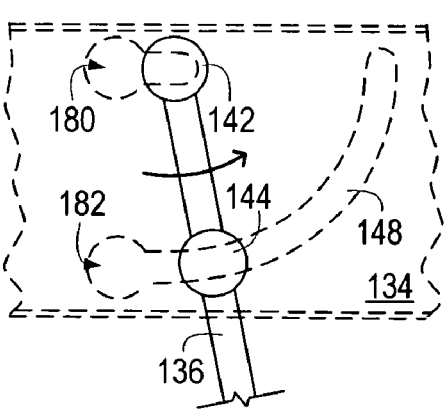
FIG. 16 is a top view of a forward link in a rotated position relative to a bracket.
Figure 17:
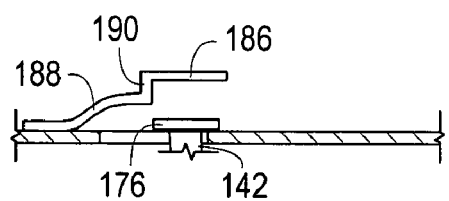
FIG. 17 is a side view of a bracket with a catch in a release position.

Forward link 136 may be moved away from rear panel 110 of component 102 such that pivot pin 142 moves into the narrow portion of slot 146 and hanger pin 144 moves into the narrow portion of slot 148 (see FIG. 15). Catch 186 may deflect downwardly under the spring force of spring portion 188 such that stop 190 engages the side of head 176 of pivot pin 142 (See FIG. 16). While head 176 of pivot pin 142 is held in place by catch 186, forward link 136 is pivotally coupled to bracket 134 about the axis of pivot pin 142 (see FIG. 16). To release forward link 136, catch 186 may be lifted up (as shown in FIG. 17) to allow head 176 of pivot pin 142 to be realigned with enlarged portion 180 of slot 146, and head 178 of hanger pin 144 may be realigned with enlarged portion 182 of slot 148. Forward link 136 may be lowered to disengage pivot pin 142 and hanger pin 144 from bracket 134.

The use of thumbscrews and/or snap-in pin/slot connection may allow cable management system 130 to be installed without using tools. In addition, forward link 136 of cable management arm 132 may be decoupled from bracket 134 without tools, if necessary, to improve access to rear panel 110.

Referring again to FIG. 3, the length of middle link 140 may be selected to achieve a low profile relative to rear panel 110, while providing an adequate bend radius of the cables when cable management arm 132 is in a closed position. In some embodiments, the length of middle link 140 may be selected to create a substantially parallel spacing between forward link 136 and rear link 138 when cable management arm 132 is in the closed position.

The arrangement, location and dimensions of bracket 134 and hanger pin 144 may be selected to provide sufficient stiffness to minimize downward displacement of the cantilevered cable management arm 132. Bracket 134 and hanger pin 144 may provide a stiffer and stronger forward joint than would be achieved with a simple pivotal connection between forward link 136 and inner slide member 116. A relatively stiff forward joint may allow the cable management system to have adequate stiffness and strength in a relatively small vertical height. A relatively stiff forward joint may also make the cable management system less susceptible to failure when the system is exposed to environmental loads such as vibration and shock.

Figure 18:
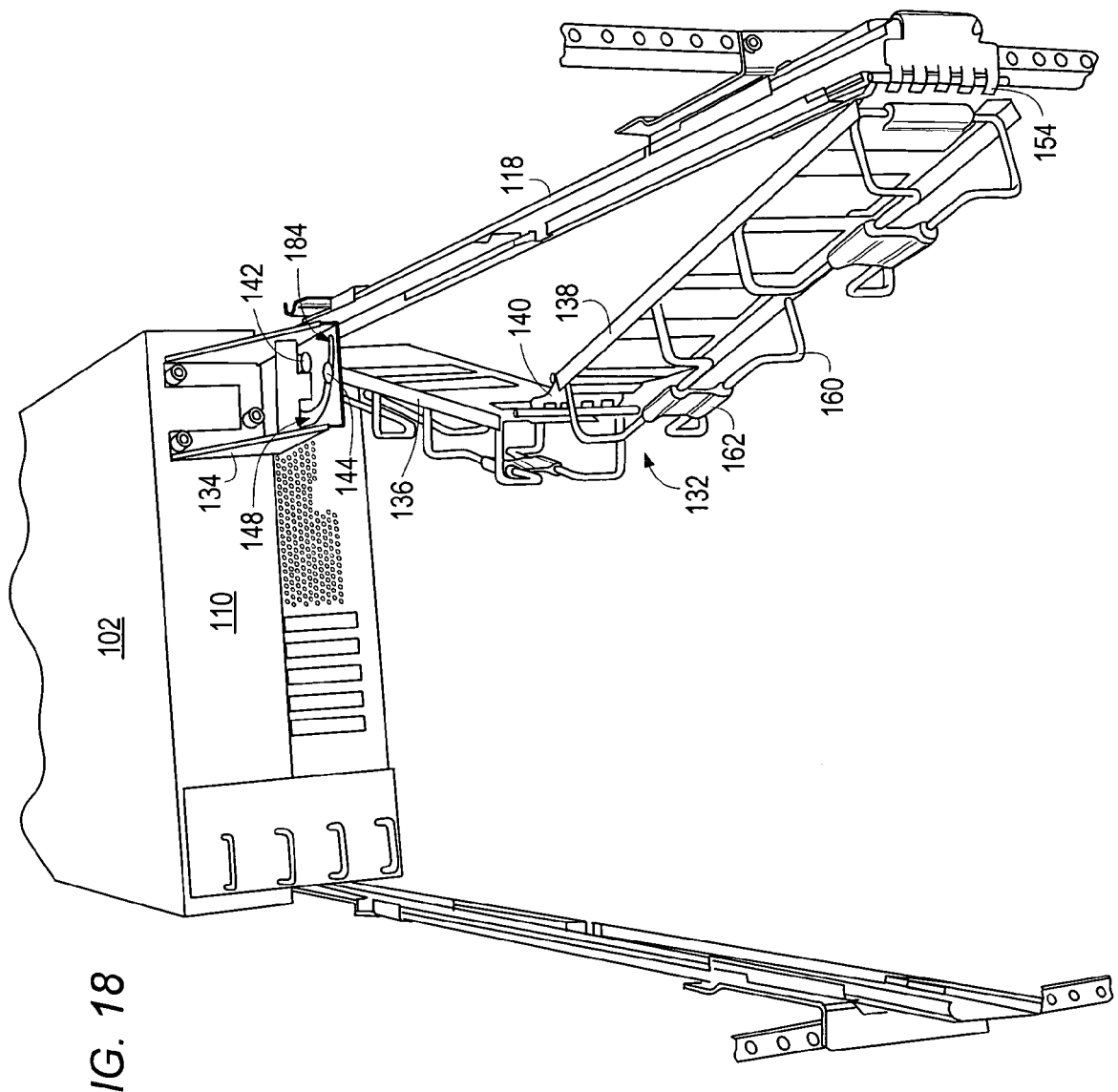
FIG. 18 depicts a cable management system when a component is partially withdrawn from a rack on slide assemblies.

FIG. 18 depicts cable management system 130 when component 102 has been withdrawn out of the front of rack 104 to a serviceable position. As component 102 and bracket 134 translate forward in rack 104, forward link 136 may rotate about pivot pin 142. Rear link 138 may rotate about hinge 154. As the distance between pivot pin 142 on bracket 134 and hinge 154 increase, forward link 136 and rear link 138 approach alignment with each other and stretch across the gap between the pivot pin 142 and hinge 154. Cable guides 160 support cables through the rackslide stroke. Hanger pin 144 moves along arcuate portion 184 of slot 148. Hanger pin 144 may bear against bracket 134 adjacent to slot 148 to inhibit sagging of forward link 136 and rear link 138. When component 102 is reinstalled in rack 104, cable management arm 132 returns to the position shown in FIG. 3.

Figure 19:
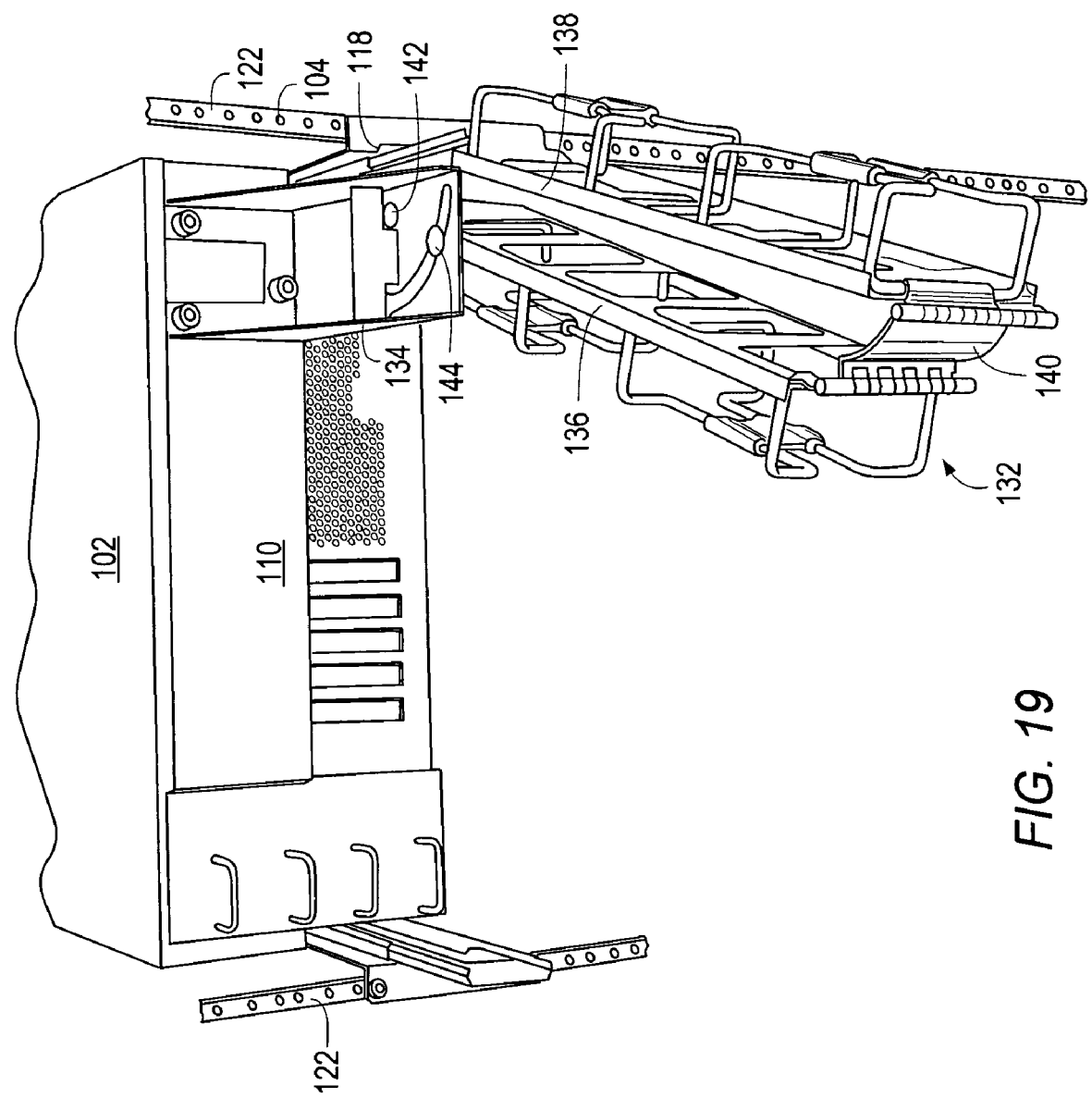
FIG. 19 depicts a cable management system when rotated away from the rear panel of a component.

As discussed above, the links of cable management arm 132 shown in FIG. 3 may be movable even when component 102 is in a stationary position in rack 104. FIG. 19 depicts cable management arm 132 rotated away from rear panel 110 of component 102. Forward link 136 may rotate about pivot pin 142. Rear link 138 may rotate about hinge 154. Hanger pin 144 may remain engaged with bracket 134 such that hanger pin 144 bears a portion of the weight of cable management arm 132. While cable management arm 132 is in the position shown in FIG. 19, service personnel have access to rear panel 110, facilitating hot swapping of modules and other service tasks.

Figure 20:
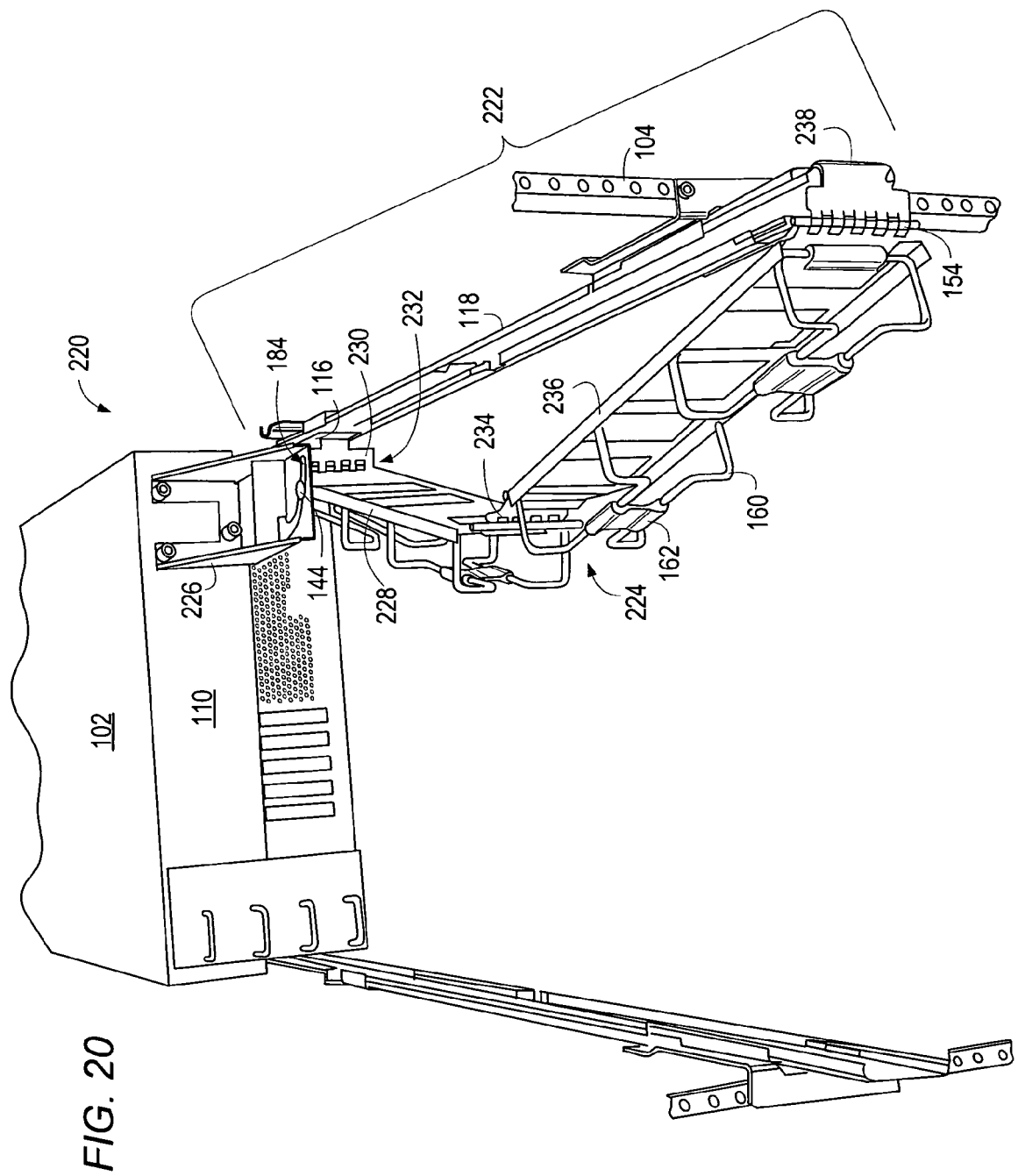
FIG. 20 depicts a cable management system including a hinge attached to an inner slide member on a component.

In another embodiment, a forward link of a cable management arm may be pivotally connected to an inner slide member on a component. FIG. 20 depicts computer system 220 including component 102, rack 104, and cable management system 222. Cable management system 222 may include cable management arm 224 and bracket 226.

Cable management arm 224 may include forward link 228 and hinge bracket 230. Hinge bracket 230 may be connected to forward link 228 at hinge 232. Middle link 234, rear link 236, and side bracket 238 of cable management arm may be the same as corresponding elements described with respect to FIG. 3. Hinge bracket 230 may be attached to inner slide member 116. In one embodiment, hinge bracket 230 is attached to inner slide member 116 using a captive thumbscrew, such as thumbscrew 194 shown in FIG. 7. Hanger pin 144 may couple in slot 148 in bracket 226. Hanger pin 144 may carry a portion of the weight of cable management arm 132, thereby reducing loads on hinge 232 and inner slide member 116 (e.g., torsion and bending loads). Reducing loads on an inner slide member may decrease the risk of structural failure or deformation of the slide member. In certain embodiments, a surface of the forward link may contact with a bottom surface of the bracket to counter the weight of the cable management arm.

In the embodiments shown in FIG. 3 and FIG. 20, the front pivot point for the forward link is at or proximate to the front end of the forward link (i.e., pivot pin 142). In other embodiments, however, a forward link may pivot at a location that is not at an end of the link. For example, in an alternate embodiment, a bracket for cable management arm 132 may include a receptacle that establishes a pivotal connection between the bracket and hanger pin 144. A top surface of forward link 136 may bear against the bottom surface of the bracket, countering the weight of cantilevered cable management arm 132. In this embodiment, pivot pin 142 may be received in an arcuate slot on the bracket (the reverse of the arrangement shown in FIG. 3) or omitted from the arm.

In the context of this patent, the term "coupled" includes direct coupling or indirect coupling (e.g., with one or more intervening elements). For example, a rear link of a cable management arm may be coupled to a forward link of the arm either directly or through one or more intervening links (e.g., a middle link). As another example, a rear link may be coupled to a rack by directly coupling the rear link to the rack or by coupling the rear link to an intervening element (e.g., an outer slide member mounted to the rack). Likewise, the term "connected" includes direct or indirect connection. The term "attached" includes direct or indirect attachment. In the context of this patent, the term "member" may include a single member or multiple members. Portions of members and links may be straight and/or curved, flexible and/or rigid, or a combination thereof.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims. For example, when the terms "forward," "rear," "front," "back," "vertical," "horizontal," "upward," "downward," "under," "over," "left," or "right" are used in the claims, they are to be understood to relate to the Figures as illustrated. However, the device may be turned at an angle to the horizontal or inverted with the quoted terms referring to the altered orientation. It will be understood that steps of a method may be performed in an order other than the order recited in a claim, unless the claim specifically states otherwise.

What is claimed is:

1. A cable management system for a component mounted in a rack, comprising:
    a rear link attachable to the rack, the rear link comprising at least one cable support;
    a forward link coupled to the rear link, the forward link comprising at least one cable support;
    a hanger pin coupled to the forward link; and
    a bracket attachable to the component, the bracket comprising a first aperture, the hanger pin being couplable to the bracket through the first aperture, the hanger pin being configured to apply a force to the bracket such that the hanger pin carries a portion of the weight of the forward link when the hanger pin is coupled to the the bracket; wherein the first aperture comprises a slot, wherein the hanger pin is configured to move along the slot when the forward link is rotated with respect to the component; wherein the bracket extends above the forward link and the rear link; and wherein the hanger pin extends above the forward link to couple with the bracket through the slot.

2. The cable management system of claim 1, further comprising a middle link coupled between the forward link and the rear link.

3. The cable management system of claim 1, wherein the hanger pin is between a front end and a back end of the forward link.

4. The cable management system of claim 1, wherein the first aperture comprises a slot, wherein the hanger pin is moveable within the slot when the forward link is positioned with respect to the bracket.

5. The cable management system of claim 1, wherein the slot comprises an arcuate portion, wherein the hanger pin is configured to move along the arcuate portion of the slot when the forward link is rotated with respect to the component.

6. The cable management system of claim 1, wherein the forward link further comprises a pivot pin proximate to a front end of the forward link, wherein the bracket comprises a second aperture, wherein the pivot pin is configured to couple in the second aperture to form a pivotal connection between the bracket and the forward link.

7. The cable management system of claim 6, wherein the bracket comprises a catch configured to retain the pivot pin in the second aperture.

8. The cable management system of claim 1, wherein engagement of the hanger pin with a top surface of the bracket and engagement of a surface of the forward link with a bottom surface of the bracket inhibit downward rotation of the forward link relative to the component under the weight of the forward link.

9. The cable management system of claim 1, further comprising a hinge configured to pivotally couple the forward link with the component.

10. The cable management system of claim 9, wherein the hinge is configured to pivotally couple the forward link with an inner slide member attached to the component.

11. The cable management system of claim 1, wherein the first aperture comprises a first slot having an enlarged portion, wherein the hanger pin is removable from the bracket when the hanger pin is aligned with the enlarged portion, wherein the hanger pin is not removable from the bracket when the hanger pin is not aligned with the enlarged portion.

12. The cable management system of claim 1, wherein the first aperture comprises a first slot having an enlarged portion, wherein the second aperture comprises a second slot having an enlarged portion, wherein the forward link is removable from the bracket when the hanger pin is aligned with the enlarged portion of the first slot and the pivot pin is aligned with the enlarged portion of the second slot.

13. The cable management system of claim 1, wherein the forward link is releasable from the bracket without the use of a tool.

14. The cable management system of claim 1, wherein the rear link is attachable to an outer slide member coupled to the rack.

15. A cable management arm for a component mounted in a rack, comprising:
a rear link configured to couple to the rack, the rear link comprising at least one cable support;
a forward link coupled to the rear link, the forward link comprising at least one cable support; and
a hanger pin coupled to the forward link between the front end and back end of the forward link, the hanger pin configured to couple with a bracket on a component to support at least a portion of the weight of the the forward link; wherein a first aperture comprises a slot, wherein the hanger pin is configured to move along the slot when the forward link is rotated with respect to the component; wherein the bracket extends above the forward link and the rear link; and wherein the hanger pin extends above the forward link to couple with the bracket through the slot.

16. The cable management arm of claim 15, further comprising a pivot pin coupled to the forward link.

17. The cable management arm of claim 15, wherein the forward link and rear link comprise openings, wherein the openings are configured to promote airflow through the cable management arm.

* * * * *